(12) United States Patent
Matsushita et al.

(10) Patent No.: US 7,486,217 B2
(45) Date of Patent: Feb. 3, 2009

(54) A/D CONVERTER

(75) Inventors: Masatoshi Matsushita, Kanagawa (JP); Masahiko Sagisaka, Kyoto (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/762,197

(22) Filed: Jun. 13, 2007

(65) Prior Publication Data

US 2007/0290914 A1 Dec. 20, 2007

(30) Foreign Application Priority Data

Jun. 16, 2006 (JP) ............... 2006-167771

(51) Int. Cl.
*H03M 1/14* (2006.01)
*H03M 3/00* (2006.01)

(52) U.S. Cl. .............. 341/161; 341/143; 341/155

(58) Field of Classification Search .......... 341/143, 341/155, 161
See application file for complete search history.

(56) References Cited

U.S. PATENT DOCUMENTS

| 4,894,656 | A | 1/1990 | Hwang et al. | |
|---|---|---|---|---|
| 5,936,562 | A | 8/1999 | Brooks et al. | |
| 6,686,860 | B2 * | 2/2004 | Gulati et al. | 341/155 |
| 2003/0164786 | A1 * | 9/2003 | Wolf et al. | 341/155 |
| 2005/0057384 | A1 * | 3/2005 | Chen et al. | 341/143 |

OTHER PUBLICATIONS

Khalil et al., "A Highly Integrated Analog Front-End for 3G," IEEE Journal of Solid-State Circuits, vol. 38, No. 5, May 2003; pp. 774-781.

Oliael et al., "A 5-mW Sigma-Delta Modulator with 84-dB Dynamic Range for GSM/EDGE," IEEE Journal of Solid-State Circuits, vol. 37, No. 1, Jan. 2002, pp. 2-10.

Dezzani et al., "A 1.2-V Dual-Mode WCDMA/GPRS ΣΔ Modulator," 2003 IEEE International Solid-State Circuits Conference, Session 3,Oversampled A/D Converters, Paper 3.3, pp. 58-59.

Veldhoven, "A Tri-Mode Continuous-Time ΣΔ Modulator with Switched-Capacitor Feedback DAC for a GSM-EDGE/CDMA2000/UMTS Receiver," 2003 IEEE International Solid-State Circuits Conference, Session 3, Oversampled A/D Converters, Paper 3.4, pp. 60-61 and 477.

Miller, "A Multibit Sigma-Delta ADC for Multimode Receivers," IEEE Journal of Solid-State Circuits, vol. 38, No. 3, Mar. 2003, pp. 475-482.

Geerts et al., "Design of Multi-Bit Delta-Sigma A/D Converters" Kluwer Academic Publishers, Boston, 2002, pp. 54-55, and 176-177.

* cited by examiner

*Primary Examiner*—Howard Williams
(74) *Attorney, Agent, or Firm*—Greenblum & Bernstein, P.L.C.

(57) ABSTRACT

An A/D converter that supports multi-mode and that can minimize power consumption is provided. A hybrid A/D converter comprises: hybrid stages composed of 1.5-bit A/D converter for pipeline use that convert analogue input signals into digital signals; 1/1.5-bit D/A converters that switch between pipeline use and delta-sigma modulation use according to the mode in use; analogue adders that subtract output of the 1/1.5 D/A converters from the analogue input signals; and analogue operation circuits that receive as input the output of the analogue adders and function as amplifiers in pipeline mode and as integrators in delta-sigma mode.

1 Claim, 17 Drawing Sheets

A/D CONVERTER

CROSS REFERENCE TO RELATED APPLICATIONS

The disclosure of Japanese Patent Application No. 2006-167771, filed on Jun. 16, 2006, including the specification, drawings and abstract, is incorporated herein by reference in its entirety.

BACKGROUND OF THE INVENTION

1. Field of the Invention

The present invention relates to A/D converters. More particularly, the present invention relates to hybrid A/D converters used in wireless communication systems such as mobile telephones and receiving devices that support multi-mode communication systems.

2. Description of the Related Art

Conventionally, a device provided with a delta-sigma (ΔΣ) modulator that performs differentiation and integration processing on analogue input to send digital output of a low number of bits, such as one bit, is known as an A/D modulator. Normally, digital output of a low number of bits from a delta-sigma modulator is converted to digital output of higher number of bits by a decimation circuit, such as a digital filter.

Receivers in the wireless communication system used in mobile telephones are generally composed of a high-frequency receiver and an A/D converter. The high-frequency receiver selects only the minimal desired waves included in radio waves received at the antenna and lowers the frequency band and amplifies these signals, and outputs baseband analogue signals. This baseband analogue signal is converted into digital signal at the A/D converter and is then input to the demodulation section. The demodulation section carries out error correction, bit synchronization and frame synchronization, and performs demodulation processing.

There is a jumble of wireless communication systems in use worldwide because of various schemes adopted by the primary contractor in accordance with national or local circumstances or strategies. As a result, users must use different wireless terminals that match the communication system provided in their country or region. The existences of multi-mode wireless terminals that support two or more communication systems alleviate inconveniences experienced by users that are active across national boundaries. That also makes it possible for the primary contractor and device manufacturers to support systems worldwide with only one terminal. Therefore, these multi-mode terminals are extremely advantageous because development efficiency has improved and the scope of sales has expanded. Among them, mobile terminals that support both the GSM scheme that has garnered a majority of the world's share, and the W-CDMA scheme that is becoming a next-generation world-wide standard, are considered to be very useful. Along with advancements made to commercialization in recent years, these terminals are expected to become even more compact, to enable longer communication time and less cost.

An A/D converter used as part of a multi-mode mobile terminal receiver will now be explained. To simplify the explanation, an example will be provided of a system that supports both the W-CDMA scheme and GSM scheme (hereinafter referred to as "dual mode").

The simplest way of implementing a conventional dual-mode A/D converter is to provide separate A/D converters to support both modes. A pipeline-scheme A/D converter is effective for an A/D converter that supports the W-CDMA scheme (for example, see non-patent document 1). A delta-sigma (ΔΣ) modulation-scheme A/D converter is effective for an A/D converter that supports the GSM scheme (for example, see non-patent document 2).

Another way of implementing a dual-mode A/D converter is to use one A/D converter that can switch modes and accommodate both modes separately. Non-patent document 3 presents an example of implementation switching the structure of an A/D converter for the delta-sigma modulation scheme. Also, non-patent documents 4 and 5 show other multi-modes than W-CDMA and GSM. Non-patent documents 4 and 5 provide examples of distinguishing between modes based on the sampling frequency band of a delta-sigma and the effective frequency band after A/D conversion, of a modulation-scheme A/D converter, thus implement a multi-mode A/D converter.

Non-patent Document 1: "A highly Integrated Analog Front-End for 3G" IEEE JOURNAL OF SOLID-STATE CIRCUITS, VOL. 38, No. 5, MAY 2003.

Non-patent Document 2: "A 5 mW ΣΔ Modulator with 84 dB Dynamic Range for GSM/EDGE" IEEE JOURNAL OF SOLID-STATE CIRCUITS, VOL. 37, No. 1, JANUARY 2002.

Non-patent Document 3: "A 1.2-V Dual-Mode WCDMA/GPRS ΔΣ Modulator", 2003 IEEE International Solid-State Circuits Conference, Session 3, oversampled A/D Converters, 3.3.

Non-patent document 4: "A Tri-Mode Continuous-Time ΣΔ Modulator with Switched-Capacitor Feedback DAC for a GSM-EDGE/CDMA2000/UMTS Receiver" 2003 IEEE International Solid-State Circuits Conference, Session 3, Oversampled A/D Converters, 3.4.

Non-patent document 5: "A Multibit Sigma-Delta ADC for Multimode Receivers" IEEE JOURNAL OF SOLID-STATE CIRCUITS, VOL. 38, No. 3, MARCH 2003.

Non-patent document 6: "DESIGN OF MULTI-BIT DELTA-SIGMA A/D CONVERTERS" Kluwer Academic Publishers.

Initially, conventional technology will be explained for providing separate A/D converters to support both modes as a dual-mode A/D converter.

FIG. 1 is a block diagram showing a configuration of a conventional pipeline-scheme A/D converter, and shows an example of a pipeline-scheme 8-bit A/D converter generally applied for the W-CDMA scheme. In FIG. 1, the pipeline-scheme 8-bit A/D converter 10 is composed of: pipeline stages 11 provided in six stages; 2-bit A/D converter 12 provided in the final stage; and a digital error correction circuit 13 that adds the digital outputs of pipeline stages 11 and the two-bit A/D converter, to correct errors.

FIG. 2 is a block diagram showing an internal configuration of a pipeline stage 11.

A pipeline stage 11, as shown in FIG. 2, is provided with a 1.5-bit A/D converter 21, 1.5-bit D/A converter 22, analogue adder 23, and two-fold (2×) amplifier 24.

An analogue input signal from the previous stage is A/D converted into 1.5 bits at the 1.5-bit A/D converter 21, and the output of the 1.5-bit A/D converter 21 is used as the digital output signal of the pipeline stage 11. The result of D/A conversion from the output of the 1.5-bit A/D converter 21 is subtracted from the analogue input signal at the analogue adder 23, and the result is amplified by the two-fold amplifier 24 and then transferred onto the next stage.

FIG. 3 shows an example of an analogue circuit for the pipeline stage of a pipeline-scheme A/D converter, and shows a switched-capacitor-type analogue circuit diagram showing an internal structure of the pipeline stage 11. Components that are identical to ones in FIG. 2 use the same reference numerals.

The analogue circuit of the pipeline stage 11 as shown in FIG. 3 is composed of: a 1.5-bit A/D converter 21; analogue switches 31 to 36; two capacitors Cf and Cs; an operational amplifier 37; and a 1.5-bit D/A converter 22 that outputs analogue signals by switching between reference voltages ±VREF and ground voltage (hereinafter 0) according to input.

First, the switch 31 and switch 32 are connected to the input signal side, and the switch 33 is closed. In this state, input signals are applied to the capacitors Cf and Cs. Next, when the switch 33 is opened, the input signal is sampled and saved. Next, the switch 31 is connected to the output of the operational amplifier 37, and the switch 32 is connected to the 1.5-bit D/A converter 22. The 1.5-bit D/A converter 22 selects and applies +VREF, 0 and −VREF voltages, to the capacitor Cs, according to the output of the 1.5-bit A/D converter 21. If Cs =Cf =C, Vout is given by the equation below.

[1]

$$V_{out} = 2\left(V_{in}\left\{+\frac{VREF}{2}, 0, -\frac{VREF}{2}\right\}\right) \quad \text{(Equation 1)}$$

As shown in the equation 1 above, the function of subtracting the D/A conversion result from the input signal and amplifying this two-fold, is implemented.

The chip rate for the W-CDMA scheme is 3.84 Mchips/s, but A/D converters that process baseband analogue signals require sampling at 15.36 MHz, which is four-time oversampling, a bit resolution of 8 bits, and a dynamic range over 44 dB, in the effective frequency band of 1.92 MHz.

The power of the pipeline-scheme A/D converter is mainly consumed by the operational amplifier. The conversion speed is mainly determined by the slew rate and settling of the operational amplifier. For that reason, it is necessary to reduce capacity to lower power consumption, but if 8 bits are required, there is less demand for the accuracy of capacitor matching, and so the capacity can be low. As a result, the requirement for the slew rate and settling is also alleviated, and the load on the operational amplifier is extremely low.

Therefore, with specifications for 15.36 MHz sampling and 8-bit resolution, pipeline-scheme A/D converters are adopted by many manufacturers because of their low power consumption. For the W-CDMA scheme, this is perfect for high-speed, yet comparatively low-resolution A/D converters.

FIG. 4 is a block diagram showing an internal configuration of the delta-sigma modulation-scheme A/D converter. FIG. 4.13 of non-patent document 6 shows an example of a delta-sigma modulation-scheme A/D converter that is generally used for the GSM scheme.

As shown in FIG. 4, the delta-sigma modulation-scheme A/D converter 40 is composed of: three analog integrators 41 to 43; three 4-bit D/A converters 44 to 46; three analogue adders 47 to 49 each positioned at an input section of the analog integrators 41 to 43, that subtract D/A conversion results from the input signal from the previous stage; a quantizer 50 that converts the output of analog integrator 43 of the final stage into digital values; and a dynamic element matching (hereinafter referred to as "DEM") logic circuit 52 that applies a digital process to whiten or noise-shaping to conversion errors generated at the quantizer 50 and D/A converters 44 to 46. If the analogue input signal is X, and the output of the quantizer 50 is Y, the transmission coefficient in the Z region when the quantized noise generated by the quantizer 50 is Q is shown in equation 2.

[2]

$$Y = X + (1-Z^{-1})^3 Q \quad \text{(Equation 2)}$$

With the input analogue signal X as it is, a noise shaping effect by the $(1-Z^{-1})^3$ part of the above equation 2 is achieved for the quantization noise Q, which improves low band noise, and, with the effect of oversampling, a high-performance A/D converter is implemented.

FIG. 5 shows a switched capacitor-type analogue circuit that executes operations at each stage of the delta-sigma modulation-scheme A/D converter.

In FIG. 5, the analogue circuit 60 of the delta-sigma modulation-scheme A/D converter is composed of: sixteen sampling capacitors Cs 1 to Cs 16; one integrated capacitor Ci; analogue switches 61 to 71; and an operational amplifier 72. First, the switches 61, 66 and 69, and the switch 62 are turned ON, and the input signals to the sampling capacitors of Cs 1 to Cs 16 are sampled and saved. Next, substantially at the same time these switches are turned OFF, the switch 63 is turned ON, and, at the same time, the switches 64, 67 and 70 or the switches 65, 68 and 71 from the switches 64, 65, 67, 68, 70, and 71 turn ON, and the +VREF or −VREF connected to the ends of the these switches are charged and the electrical charge saved in the sampling capacitors is charged or discharged for subtraction process and integrated to the integral capacitor Ci. In other words, the function for addition (or subtraction), D/A conversion and integration is implemented by this switched capacitor-type analogue circuit 60.

The symbol rate of the GSM scheme is 270.833 k symbols/s. However, to cover the bandwidth of the 8 PSK modulation signal that supports a 2.5th generation GSM standard, called "EDGE," (for example, see non-patent document 2) that triples the performance of GSMK modulation of the conventional GSM scheme, the A/D converter that processes baseband analogue signals requires a sampling rate of 541.666 kHz, which is twice the symbol rate, an effective frequency band of 180 kHz, and a dynamic range of 84 dB or higher. To convert the above to a bit resolution, it is 14 bits or higher. According to FIG. 2.28 of non-patent document 6, delta-sigma modulation0scheme A/D converter achieves a dynamic range of 90 dB or higher with twenty-four time oversampling or more.

With GSM-scheme mobile telephones, there are many examples where the system clock is 13 MHz. If a delta-sigma modulation-scheme A/D converter is operated at this system clock, approximately thirty-six time oversampling can be ensured for the effective frequency band of 180 kHz, and, by lowering the sampling rate to two-times while removing return images using a decimation digital filter at a later stage, a GSM-scheme A/D converter can be implemented that satisfies the desired specifications.

A pipeline-scheme A/D converter is not suited to a region higher than 12 bits, and so many manufacturers adopt a delta-sigma modulation-scheme A/D converter from the viewpoint of higher performance. These are well suited for A/D converters for GSM that have high resolution and comparatively low-speed.

Conventional technology for using one A/D converter to support both modes as a dual-mode A/D converter, will now be explained.

It has already been explained with reference to FIG. 4 that a delta-sigma modulation-scheme A/D converter is suited for the GSM scheme. According to FIG. 2.28 in non-patent document 6, a dynamic range of 60 dB or higher is possible when this A/D converter is operated at eight-time oversampling. Therefore, a delta-sigma modulation-scheme A/D converter that satisfies the required specifications for W-CDMA can be implemented by operating at 30.72 MHz, which is eight times the double of the effective frequency band of 1.92 MHz, and lowering the sampling rate to four times while removing return images, by a decimation digital filter at a later stage. That is to say, in the GSM mode, the A/D converter is operated at 13 MHz and the sampling rate is lowered to 1/24 with the decimation digital filter at a later stage, and, in the W-CDMA mode, the A/D converter is operated at 30.72 MHz and the sampling rate is lowered the ½ with the decimation digital filter at a later stage. By changing the operation clock and decimation rate according to the mode in use, it is possible to accommodate both modes with a single A/D converter, and there are several examples of application of that principle (see non-patent documents 3, 4, and 5).

Nevertheless, a dual-mode A/D converter that is implemented by providing both the conventional pipeline-scheme A/D converter (FIG. 1) and the delta-sigma modulation-scheme A/D converter (FIG. 4), essentially has the problem of an enlarged circuit surface area, because two A/D converters of substantially the same scale are provided.

Also, the delta-sigma modulation-scheme A/D converter shown in FIG. 4 that supports both modes using one delta-sigma modulation-scheme A/D converter, is operated at a high clock speed of 30.72 MHz in W-CDMA mode, and so the required specifications for the operational amplifier and quantizer, which are the essential analogue circuits, are strict, and, as a result, there is a problem of significant power consumption in W-CDMA mode.

SUMMARY OF THE INVENTION

It is therefore an object of the present invention to provide a multi-mode A/D converter that provides two A/D converters of different schemes and that minimizes increase in circuit scale and minimizes power consumption in both modes.

According to an aspect of the invention, an A/D converter is provided with: an A/D converter for pipeline use, that converts an analogue input signal into a digital signal; a D/A converter that switches between pipeline use and delta-sigma modulation use according to a mode in use; an analogue adder that subtracts an output of the D/A converter from the analogue input signal; and a hybrid stage comprising an analogue operation circuit that receives as input an output of the analogue adder and functions as an amplifier in a pipeline mode and as an integrator in a delta-sigma mode.

According to another aspect of the present invention, an A/D converter is provided with: an A/D converter for pipeline use, that converts an analogue input signal into a digital signal; a D/A converter that switches between pipeline use and delta-sigma modulation use according to a mode in use; an analogue adder that subtracts an output of the D/A converter from the analogue input signal; a hybrid stage comprising an analogue operation circuit that receives as input an output of the analogue adder and functions as an amplifier in a pipeline mode and as an integrator in a delta-sigma mode; and an A/D converter that switches between pipeline use and a delta-sigma modulation quantizer use according to the mode in use.

DETAILED DESCRIPTION OF THE PREFERRED EMBODIMENTS

Preferred embodiments of the present invention will be explained in detail with reference to the accompanying drawing.

Embodiment 1

Figure 6:
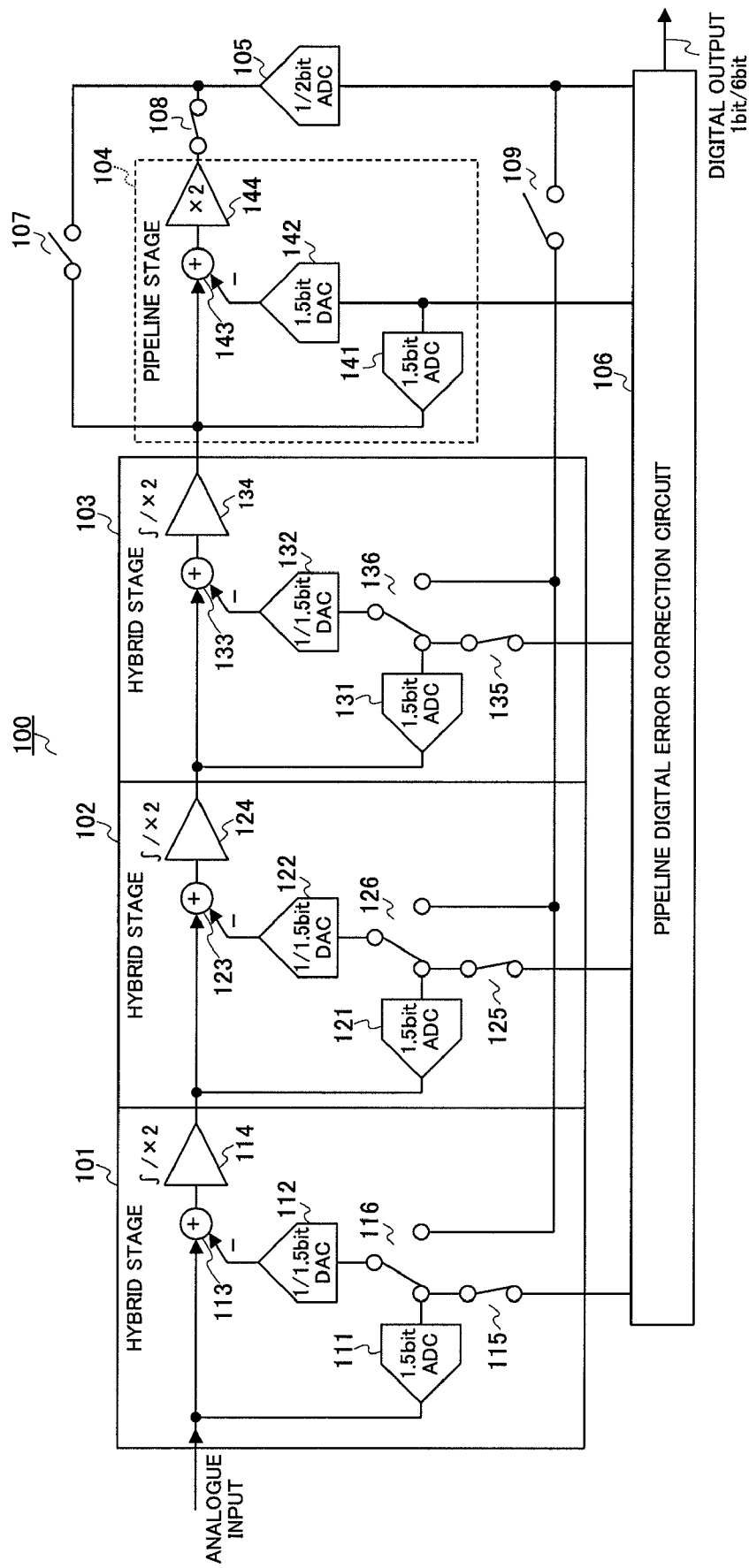
FIG. 6 is a circuit diagram showing a configuration of a hybrid A/D converter according to embodiment 1 of the present invention.

FIG. 6 is a circuit diagram showing a configuration of a pipeline A/D converter according to embodiment 1 of the present invention. This embodiment is an example applied to a hybrid A/D converter that outputs 1 bit/6 bits of digital output.

The hybrid A/D converter 100 shown in FIG. 6 is composed of a plurality of stages of hybrid stages 101 to 103 having analogue operation circuits that function as amplifiers in pipeline mode and that function as integrators in delta-sigma mode; a pipeline stage 104 that forms a final stage of the pipeline stage along with the hybrid stages 101 to 103 in pipeline mode; a ½-bit A/D converter 105 that switches between 1 bit for pipeline and 2 bits for the quantizer for delta-sigma modulation according to the mode in use; a digital error correction circuit 106 for pipeline, that corrects errors by adding the digital outputs of hybrid stages 101 to 103, pipeline stage 104 and ½-bit A/D converter 105; and analogue switches 107 to 109.

The hybrid stages 101 to 103, adopting the same configuration, are composed of: a 1.5-bit A/D converters 111, 121 and 131 for pipeline that convert analogue input signals into digital signals; ⅟₁.₅-bit D/A converters 112, 122 and 132 that switch between the pipeline scheme and the delta-sigma modulation scheme according to the mode in use; analogue adders 113, 123 and 133 that subtract the output of the ⅟₁.₅-bit D/A converters 112, 122 and 132 from the analogue input signals; analogue operation circuits 114, 124 and 134 that receives as input the output of the analogue adders 113, 123 and 133 and function as amplifiers in pipeline mode and as integrators in delta-sigma mode; and analogue switches 115, 116, 125, 126, 135 and 136.

The analogue operation circuits 114, 124 and 134 are operational amplifiers that change current consumption according to the mode requirement characteristics.

The pipeline stage 104 is composed of: a 1.5-bit A/D converter 141 for pipeline that converts analogue input signals to digital signals; a 1.5-bit D/A converter 142 for pipeline; an analogue adder 143 that subtracts output of the 1.5 D/A converter 142 from the analogue input signals; and an analogue operation circuit 144 that receives as input the output of the analogue adder 143 and functions as an amplifier in pipeline mode. The pipeline stage 104 is unique in that the analogue operation circuit 144 has only a function of an amplifier and does not have an analogue switch for mode switching. The pipeline stage 104 itself becomes a bypass in delta-sigma mode.

By switching the analogue switches 107 to 109, 115, 116, 125, 126, 135, and 136 ON and OFF, it is possible to switch the functions of each circuit according to the mode in use, and to switch the hybrid switches 101 to 103 between the pipeline-scheme stage and the delta-sigma modulation scheme stage. Switching functions of the circuits according to the mode in use means, specifically: (1) to switch between 1 bit for pipeline and 2 bits for the quantizer for delta-sigma modulation, in the ½-bit A/D converter 105; (2) to switch between the pipeline of the ⅟₁.₅ bit D/A converters 112, 122 and 132 and delta-sigma modulation; and (3) to switch between the amplifier in pipeline mode for the analogue operation circuits 114, 124 and 134, and the integrator in delta-sigma mode. The analogue switch has the function of the hybrid stages 101 to 103 along with the control circuit (not shown) that controls the switching of the analogue switches, and the function as a switching means that switches between the pipeline-scheme stage and the delta-sigma modulation-scheme stage according to the mode in use.

In this way, there is one or a plurality of hybrid stages 101 to 103 disposed to replace the pipeline stage of the conventional pipeline-scheme A/D converter.

Figure 7:
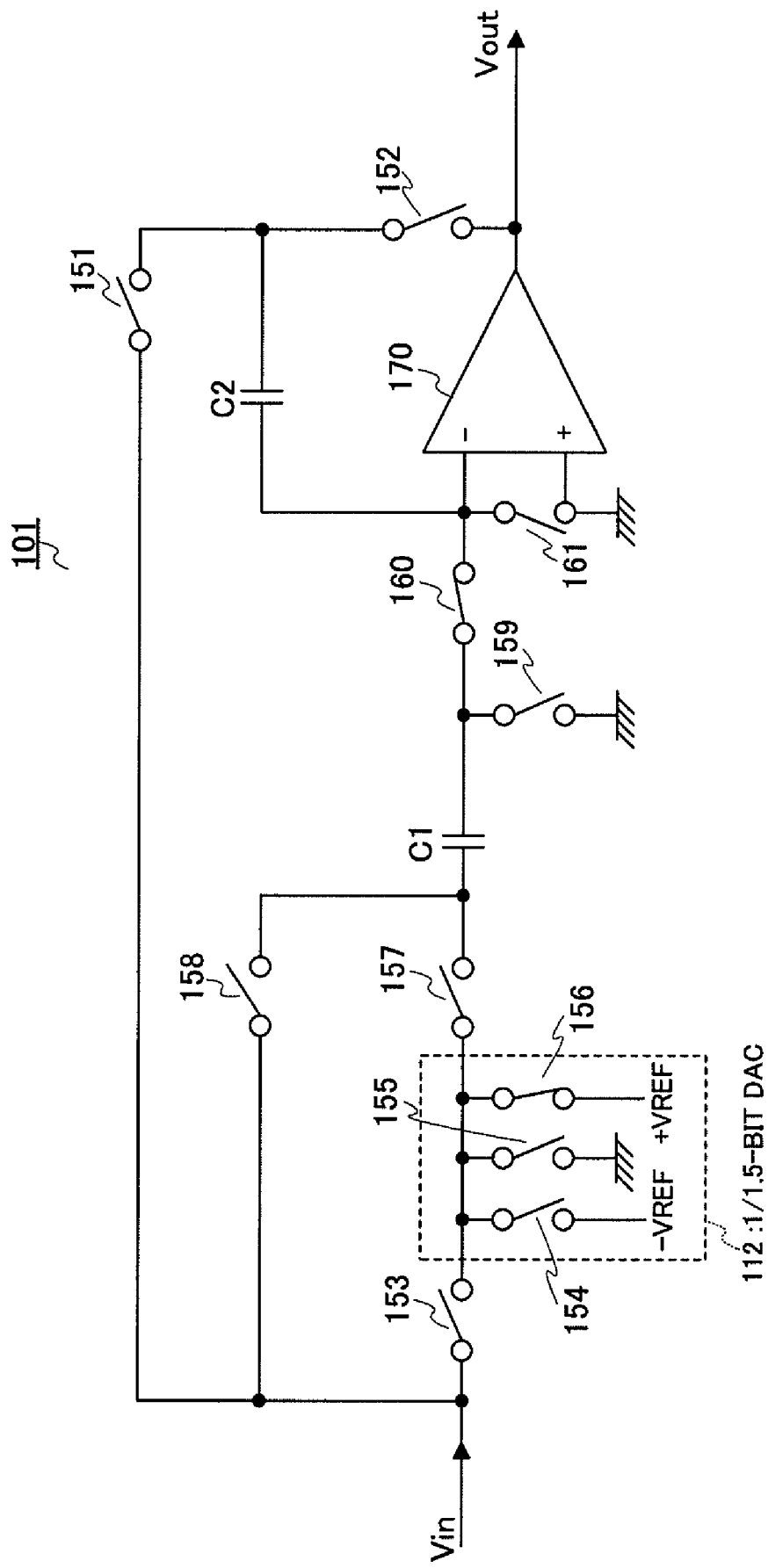
FIG. 7 is a switched capacitor-type analogue circuit diagram showing an internal configuration of a hybrid stage of a hybrid A/D converter according to embodiment 1 of the present invention.

FIG. 7 is a switched capacitor-type analogue circuit diagram that shows an internal configuration of the hybrid stage of the hybrid A/D converter 100. The hybrid stages 101 to 103 adopt the same configuration; the pipeline stage 104 is different only in that it does not have the analogue switches of the hybrid stages 101 to 103, so it is shown represented by hybrid stage 101.

The analogue circuit of the hybrid stage 101 shown in FIG. 7 is composed of: analogue switches 151 to 161; two capacitors C1 and C2; an operational amplifier 170; and a ⅟₁.₅-bit D/A converter 112 that switches the reference voltages ±VREF and 0 according to input, and outputs analogue signals.

Figure 4:
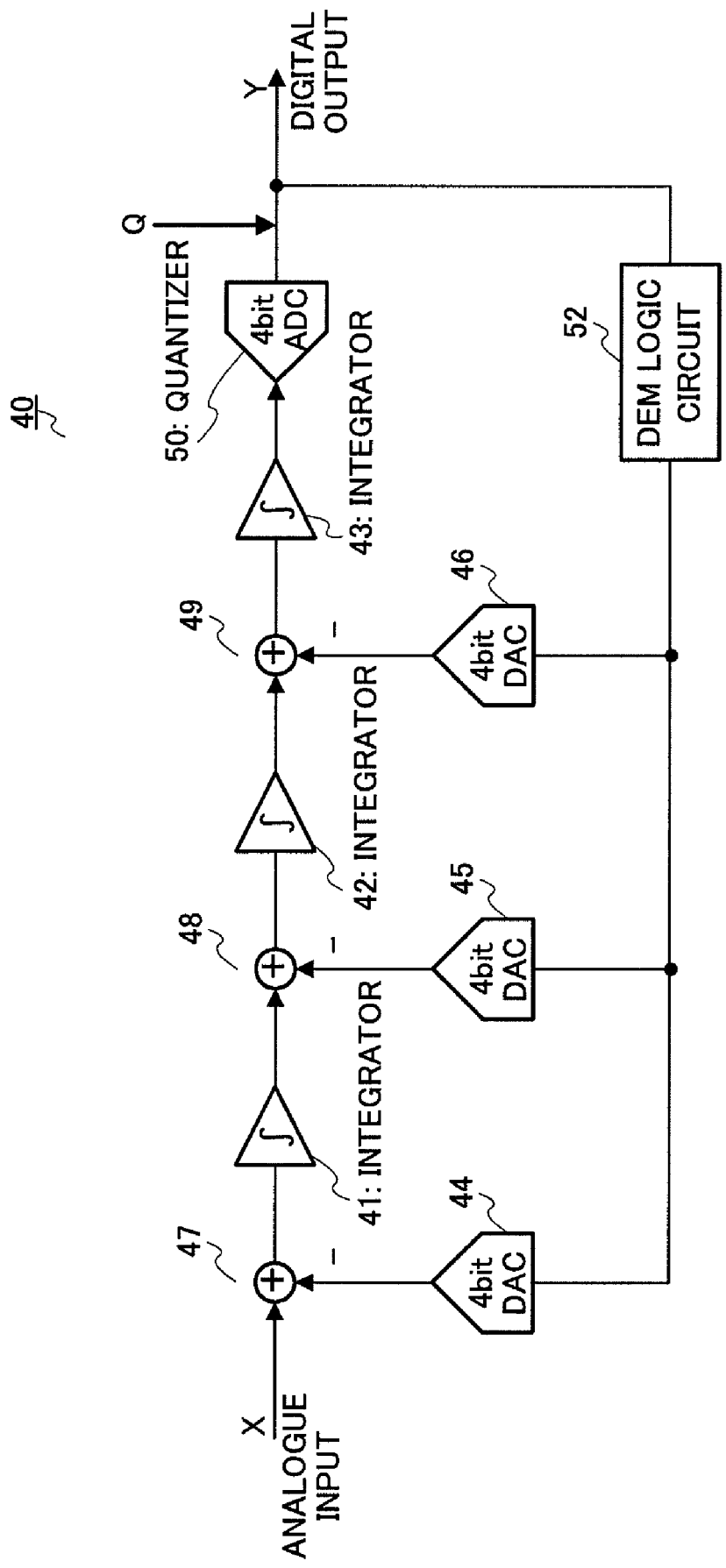
FIG. 4 is a block diagram showing a configuration of a conventional delta-sigma modulation-scheme A/D converter.
Figure 5:
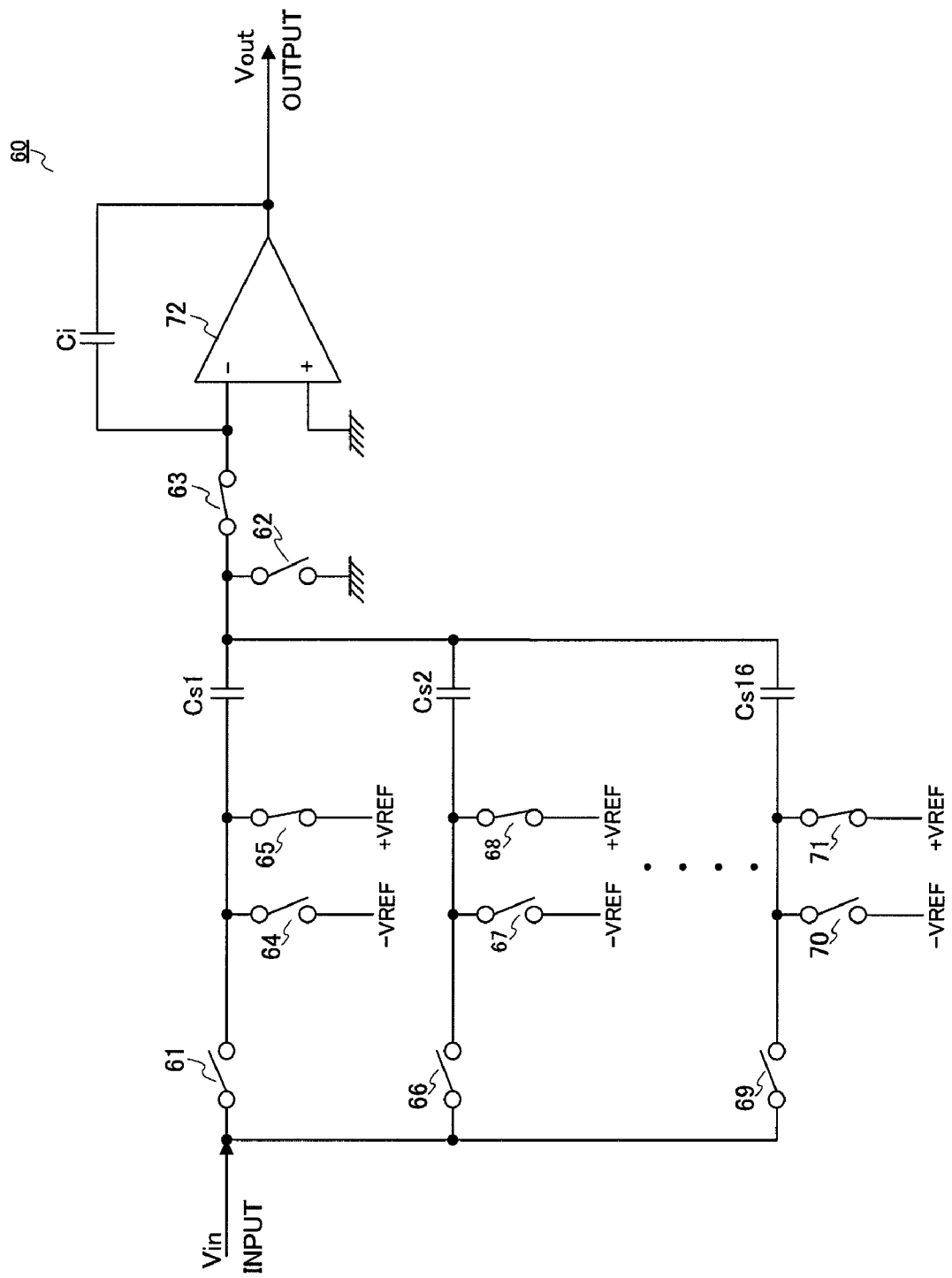
FIG. 5 is a switched capacitor-type analogue circuit that executes operations at each stage of the conventional delta-sigma modulation-scheme A/D converter.

Note that FIG. 7 shows an analogue circuit of the hybrid stage 101 in delta-sigma mode, and so the 1.5-bit A/D converter 111 shown in FIG. 6 is not shown. The hybrid A/D converter 100 is an A/D converter that outputs 1 bit/6 bits of digital output, and so the DEM logic circuit of FIG. 4 is not necessary.

The operations of the hybrid A/D converter 100 described above will now be explained.

The hybrid A/D converter 100 is provided with: the hybrid stages 101 to 103 that have analogue operation circuits 114, 124 and 134 that function as amplifiers in pipeline mode and as integrators in delta-sigma mode; and the pipeline stage 104 that forms the pipeline stage along with the hybrid stages 101 to 103 in pipeline mode. Therefore, the circuit configurations shown FIGS. 6 and 7 are unique in that each is in an active state in pipeline mode or in delta-sigma mode. The operations of each mode will now be explained.

Figure 8:
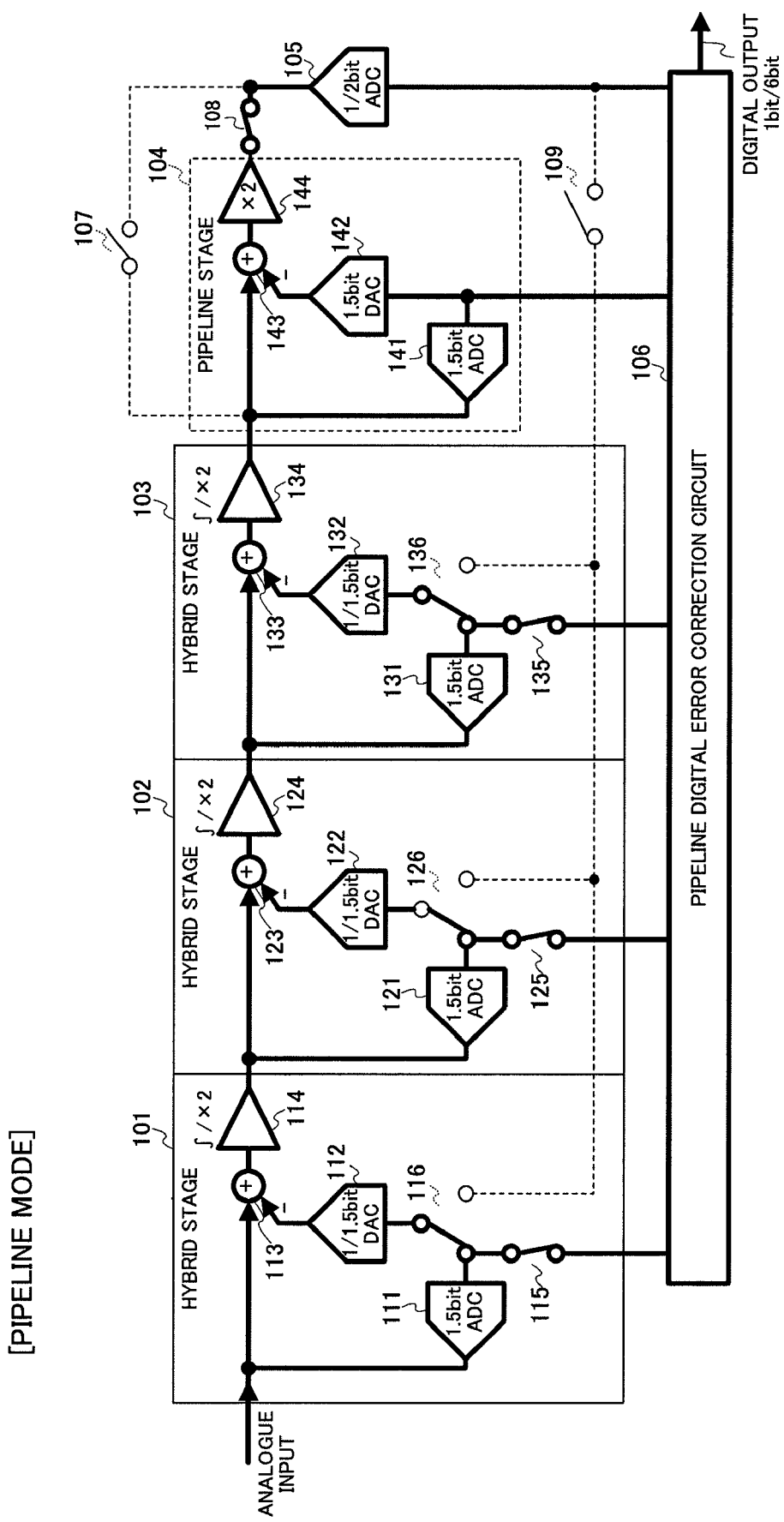
FIG. 8 is a circuit diagram showing an operation of the hybrid A/D converter shown in FIG. 6 in pipeline mode.

FIG. 8 is a circuit diagram showing the operations in pipeline mode of the hybrid A/D converter 100 shown in FIG. 6.

Figure 9:
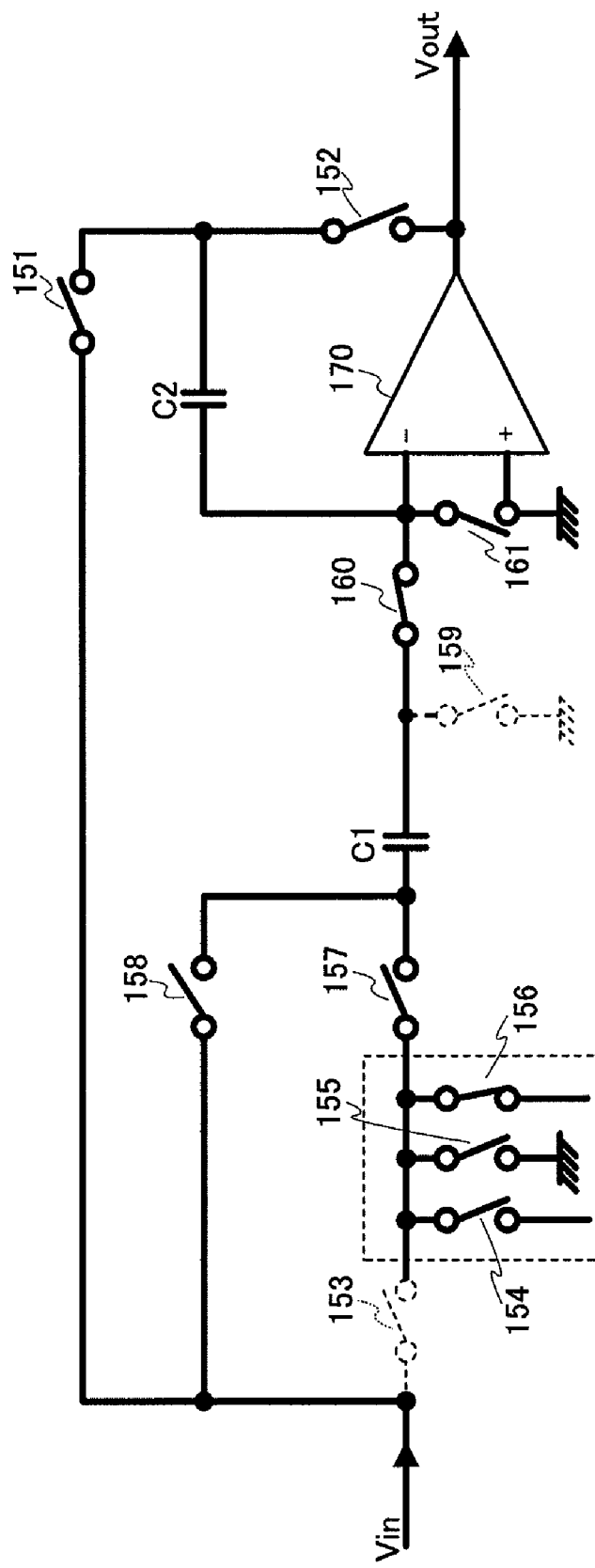
FIG. 9 is a circuit diagram showing an operation of an analogue circuit of the hybrid stage shown in FIG. 7 in pipeline mode.

FIG. 9 is a circuit diagram showing the operations of the analogue circuit in pipeline mode of the hybrid stage 101 shown in FIG. 7. In FIGS. 8 and 9, the function sections in an active state are shown with solid, bold lines and the function sections in an inactive state are shown with dashed lines.

[Pipeline Mode]

As shown in FIG. 8, the switches 116, 126 and 136 of the hybrid stages 101 to 103 are connect to the output of the 1.5-bit A/D converter 111, 121 and 131; switches 115, 125 and 135 are ON; switches 107 and 109 are OFF; switch 108 is ON thereby using the analogue operation circuits 114, 124 and 134 in each of the hybrid stages 101 to 103 as amplifiers, and using the final stage ½-bit A/D converter 105 as a 2-bit A/D converter. This configuration makes it possible for this circuit to function as the hybrid A/D converter 100. FIG. 9 shows the operations of the hybrid stages 101 to 103 and the pipeline stage 104 for pipeline mode. FIG. 9 shows a representative of the operation of the hybrid stage 101 of the pipeline mode, but the operations are the same as those for the hybrid stage 102 and 103. Also the final stage pipeline stage pipeline stage 104 is not a switch that corresponds to the switches 115 and 116 of the hybrid stage 101. However, if it is considered that for pipeline mode, switches 115 and 116 are ON; the analogue switch 108 is ON; and the analogue switch 107 is OFF, the configuration of the pipeline stage 104 is the same as the configuration of the hybrid stages 101 to 103 in pipeline mode. Therefore, the hybrid stages 101 to 103 and the pipeline stage 104 forms a four-stage pipeline in pipeline mode.

As shown in FIG. 9, the analogue circuit of the hybrid stage 101 is composed of analogue switches 153, 154, 155, 156, 157, 158, 159, 160, 161, 151 and 152; two capacitors C1 and C2; an operational amplifier 170; and a ⅟₁.₅-bit D/A converter 112 that switches the reference voltages ±VREF and 0 according to input and outputs analogue signals. In pipeline mode, this switches the analogue switches to set the circuits shown with solid, bold lines in FIG. 9 to an active state.

Specifically, the analogue switches 153 and 159 are OFF; and the analogue switch 160 is ON. This enables the analogue circuit of the hybrid stage 101 to function as a pipeline stage.

First, the analogue switch 158 and analogue switch 151 are ON; the analogue switches 157 152 are OFF; and the analogue switch 161 is ON. In this state, input signals are applied to the capacitors C1 and C2. Next, when the analogue switch 161 is OFF, the input signals are sampled and saved. Next, the analogue switch 157 and analogue switch 152 are ON; and the analogue switch 158 and analogue switch 151 are OFF. The $\frac{1}{1.5}$-bit D/A converter 112 selects the voltage of +VREF, 0, and −VREF according to the output of the 1.5-bt A/D converter 111 (see FIG. 8) and applies that to the capacitor C1. When C1=C2=C, Vout is given by the equation 1 described above.

As shown in the equation 1 above, the hybrid stages 101 to 103 and the pipeline stage 104 implement the pipeline stage function which is to subtract the D/A converter results from the input signals and amplify that two-fold.

Figure 10:
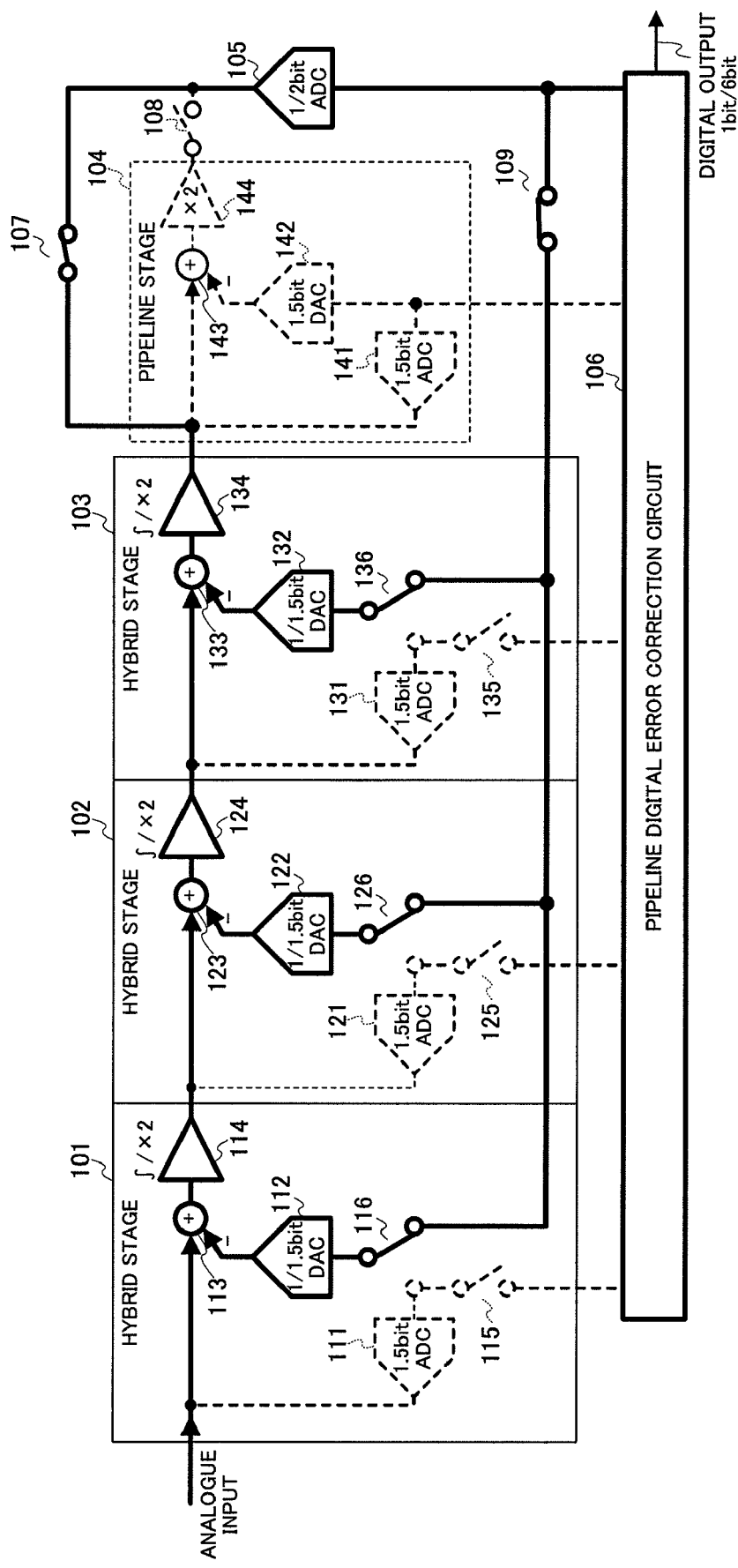
FIG. 10 is a circuit diagram showing an operation of the hybrid A/D converter shown in FIG. 6 in delta-sigma mode.
Figure 11:
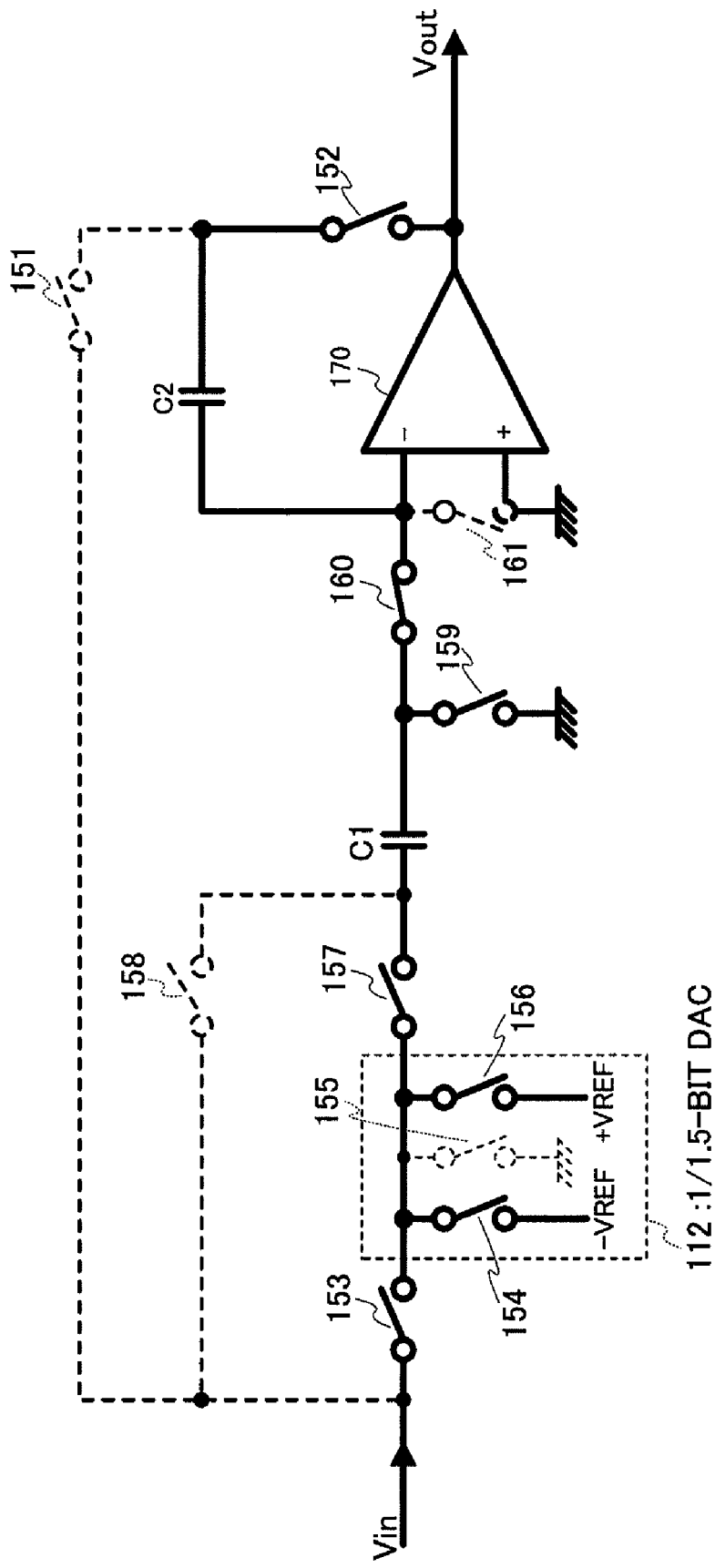
FIG. 11 is a circuit diagram showing an operation of an analogue circuit of the hybrid stage shown in FIG. 7 in delta-sigma mode.

FIG. 10 is a circuit diagram showing the operations of the hybrid A/D converter 100 shown in FIG. 6 in delta-sigma mode. FIG. 11 is a circuit diagram showing the operations of the analogue circuit in delta-sigma mode of the hybrid stage 101 shown in FIG. 7. In FIGS. 10 and 11, the function sections in an active state are shown with solid, bold lines and the function sections in an inactive state are shown with dashed lines.

[Delta-Sigma Mode]

As shown in FIG. 10, the analogue switch 109 is ON; the analogue switches 116, 126 and 136 of the hybrid stages 101 to 103 are connected to the analogue switch 109 that was turned ON; analogue switch 115, 125 and 135 are OFF; the analogue switch 107 is ON; and the analogue switch 108 is OFF. This forms the delta-sigma modulation circuit shown in the solid, bold lines in FIG. 9. The difference to the reference analog voltage that is the output of the $\frac{1}{1.5}$-bit D/A converters (here, they are 1-bit D/A converters) 112, 122 and 132 in the analogue input signals is subtracted by the analogue adders 114, 124 and 134. That difference signal is integrated by the analog integrators 114, 124 and 134 that function here as the integrators. The integrated signals are then quantized to digital signals at the ½-bit A/D converter 105 that functions as the quantizer. The quantized signal is input to the $\frac{1}{1.5}$-bit D/A converters (now 1-bit D/A converters) 112, 122 and 132, then input to the analogue adders 114, 124 and 134, as the reference analog voltage. In this way, it is possible for the analogue operation circuits 114 to 134 in each of the hybrid stages 101 to 103 as the integrators, and the final stage ½-bit A/D converter 105 as a 1-bit A/D converter 100 to function as a delta-sigma modulation-scheme A/D converter. In this case, because the pipeline stage 104 is not used, and so it is adequate to turn power OFF.

As shown in FIG. 11, the analogue switches 161, 151, 158 and 155 are OFF, and the analogue switches 152 and 157 are ON. This enables the hybrid stage analogue circuit to function as a switched capacitor-type analogue circuit that executes operations at each stage of the delta-sigma modulation-scheme A/D converter.

First, the analogue switch 160 is OFF, and the analogue switch 153 and analogue switch 159 are ON. This causes the input signals to be sampled and saved in the sampling capacity of the capacitor C1. Next, substantially at the same time these analogue switches are turned OFF, analogue switch 160 is turned ON, and the analogue switch 154 or analogue switch 156 is turned ON according to 1-bit output of the ½-bit A/D converter 105 that functions as the quantizer. This causes the +VREF or −VREF connected to the ends of these analogue switches to be charged and the electrical charge saved in the sampling capacitors to be charged or discharged, subtracted, and integrated to the integral capacitor C2. In other words, an analogue operation function for delta-sigma modulation to add (or subtract), D/A convert and integrate is fulfilled by this switched capacitor-type analogue circuit.

Thus, according to this embodiment of the present invention, the hybrid A/D converter 100 is composed of: 1.5-bit A/D converters 111, 121 and 131 for pipeline that convert analogue input signals into digital signals; $\frac{1}{1.5}$-bit D/A converters 112, 122 and 132 that switch between pipeline use and delta-sigma modulation use according to the mode in use; analogue adders 113, 123 and 133 that subtract the outputs of the $\frac{1}{1.5}$-bit D/A converters 112, 122 and 132 from the analogue input signals; hybrid stages 101 to 103 composed of the analogue operation circuits 114, 124 and 134 that receive as input the output of the analogue adders 113, 123 and 133 and function as amplifiers in pipeline mode and as integrators in delta-sigma mode; and the ½-bit A/D converter 105 that switches between pipeline use and the quantizer for delta-sigma modulation according to the mode in use. This configuration switches between the pipeline-scheme A/D converter and the delta-sigma modulation-scheme A/D converter by switch the analogue switches 107 to 109, 115, 116, 125, 126, 135 and 136 ON and OFF, so that a minimum increase in the circuit scale is possible while equipping A/D converters for two different schemes, and the power consumption in each mode is minimized. In this way, a multi-mode hybrid A/D converter 100 is implemented by application of the present invention. Incidentally, the name hybrid A/D converter was first coined by the inventors.

Details of the effects will now be explained. According to this embodiment of the present invention, two types of A/D converters—namely, a pipeline-scheme A/D converter (see FIGS. 8 and 9) that is suited for the requirements of a high-speed, yet comparatively low-resolution A/D converter, and a delta-sigma modulation-scheme A/D converter (see FIGS. 10 and 11) that is suited for the requirements of a comparatively low-speed, high resolution A/D converter—are provided, and the components of a switched capacitor circuit, which is a primary analogue circuit in an A/D converter, are shared between the two A/D converters, it is possible to minimize the increase in the circuit scale and minimize power consumption because there is no need for a high-speed clock required in high-oversampling when a circuit functions as a high-speed, comparatively low resolution A/D converter 100.

Figure 1:
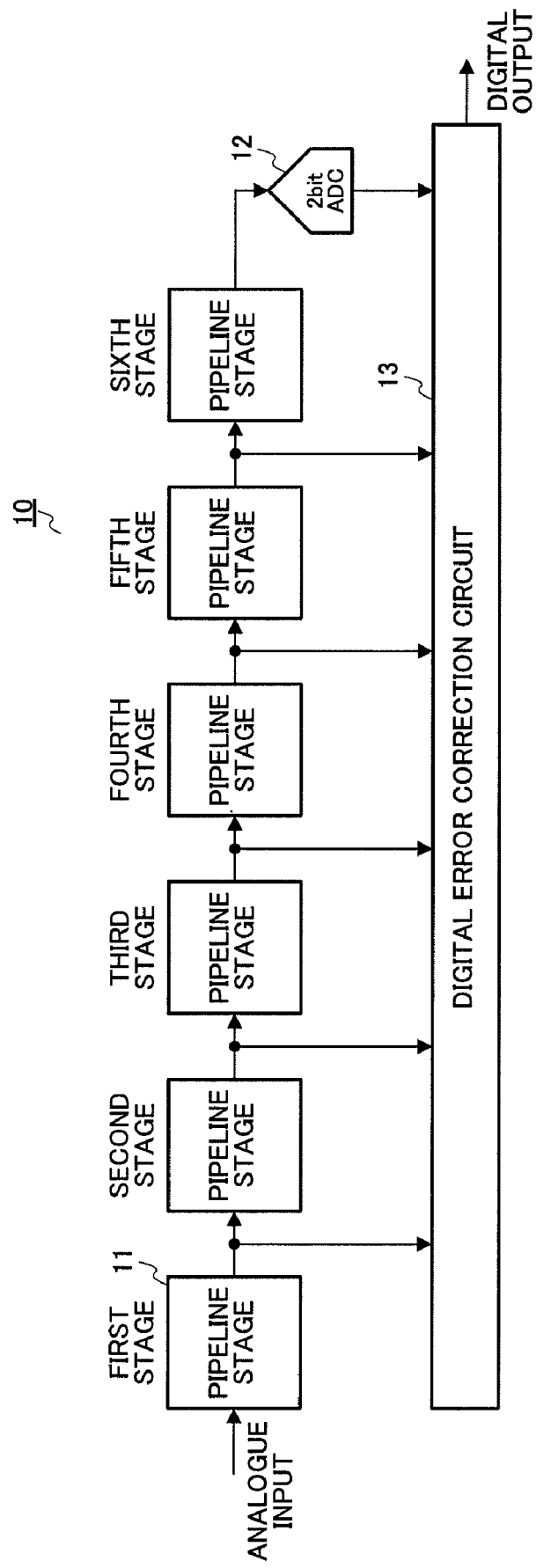
FIG. 1 is a block diagram showing a configuration of a conventional pipeline-scheme A/D converter.
Figure 2:
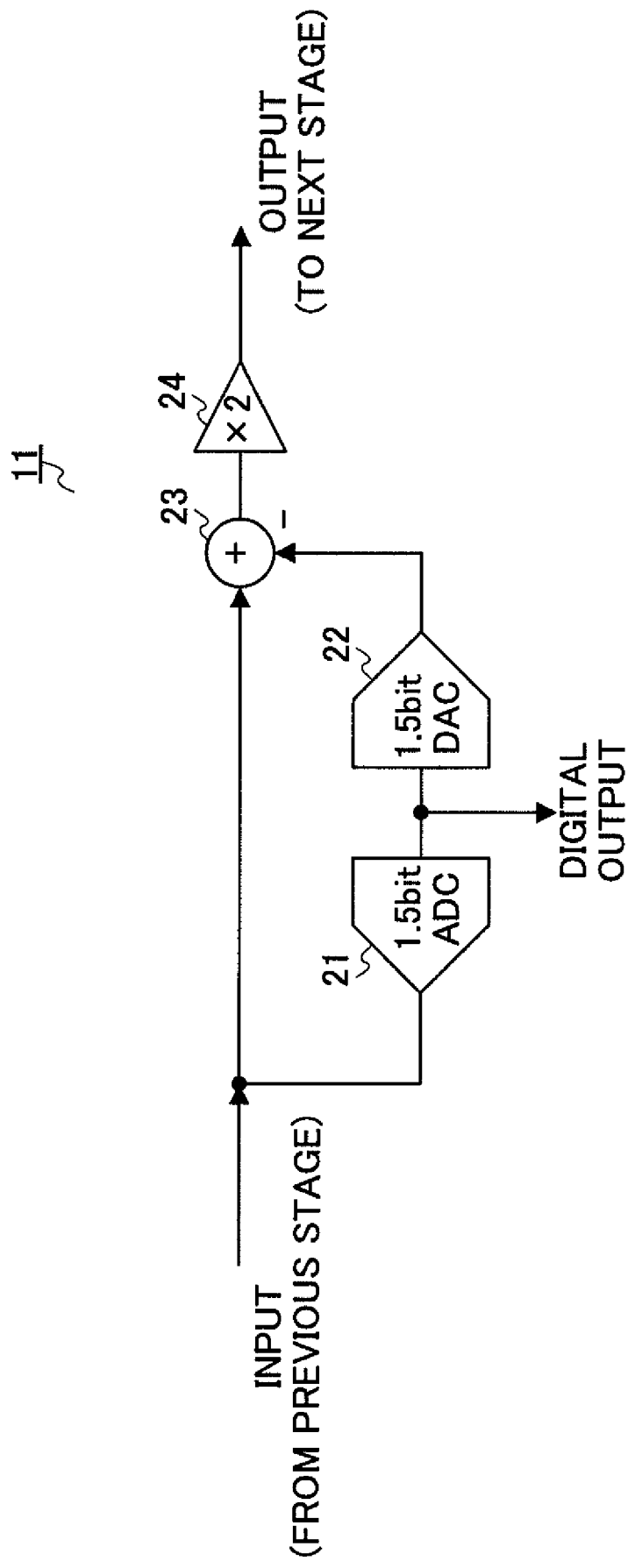
FIG. 2 is a block diagram showing an internal configuration of a pipeline stage of a conventional pipeline-scheme A/D converter.
Figure 3:
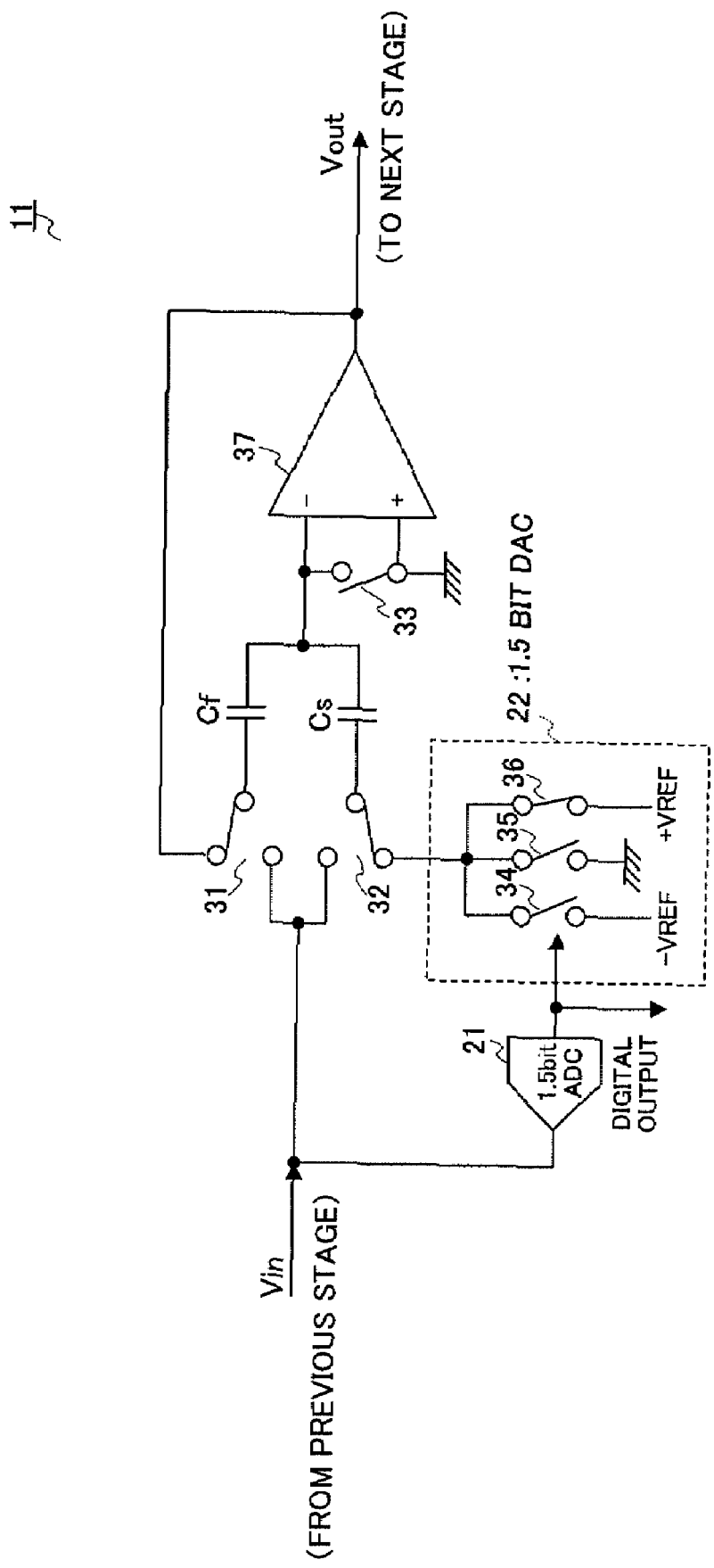
FIG. 3 is an analogue circuit diagram of a pipeline stage of a conventional pipeline-scheme A/D converter.

According to this embodiment, examples are provided for a 4-stage configuration of a pipeline stage in pipeline mode, and a tertiary configuration for delta-sigma modulation, so three hybrid stages 101 to 103 and one pipeline stage 104 are provided, but, when the delta-sigma modulation has a quartic configuration, 4 hybrid stages are employed (the pipeline stage 104 is unnecessary). Other multiple configurations are the same; the degree and bits are also effective in any combination. For example, if the conventional 8-bit pipeline-scheme A/D converter shown in FIG. 1 is produced with the hybrid A/D converter 100 of the embodiment shown in FIG. 6, there will be five hybrid stages and one pipeline stage.

Embodiment 2

Figure 12:
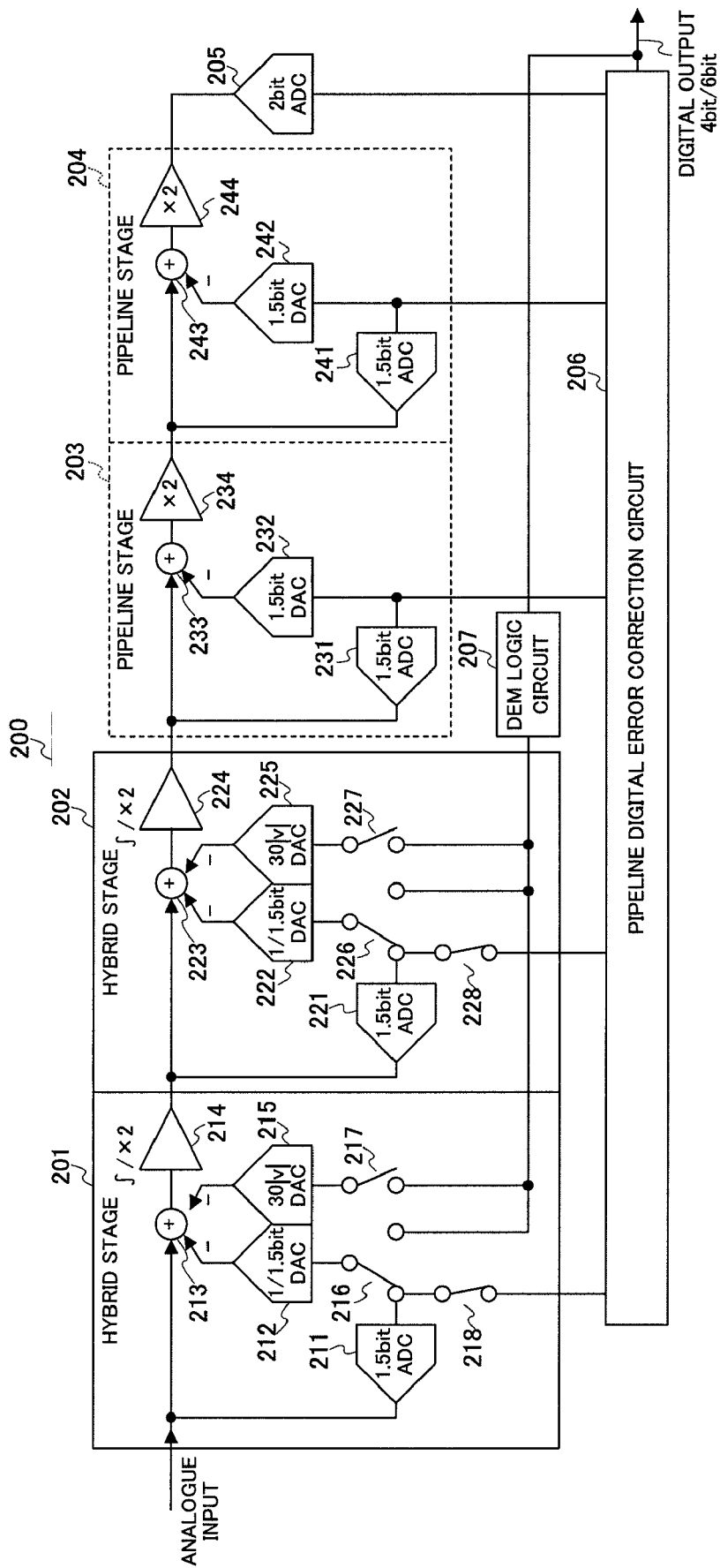
FIG. 12 is a circuit diagram showing a configuration of the hybrid A/D converter according to embodiment 2 of the present invention.

FIG. 12 is a circuit diagram showing a configuration of the hybrid A/D converter according to embodiment 2 of the present invention. This embodiment is an example of the present invention applied to a hybrid A/D converter that outputs 4 bits/6 bits of digital output.

The hybrid A/D converter 200 shown in FIG. 12 is composed of: a plurality of stages of hybrid stages 201 and 202 having analogue operation circuits that function as amplifiers in pipeline mode and as integrators in delta-sigma mode; pipeline stages 203 and 204 that form the pipeline stage with the hybrid stages 201 and 202 in pipeline mode; a 2-bit A/D converter 205 that shares both modes; a pipeline digital error correction circuit 206 that corrects errors by adding the digital outputs of hybrid stages 201 and 202, pipeline stages 203 and 204 and 2-bit A/D converter 205; and a DEM logic circuit 207 that digitally processes to whiten or noise-shape conversion errors generated by the quantizer and D/A converter.

The hybrid stages 201 to 202, adopting the same configuration, are composed of: 1.5-bit A/D converters 211 and 221 for pipeline that convert analogue input signals into digital signals; 1/1.5-bit D/A converters 212 and 222 that switches the reference voltages ±VREF according to input and output analogue signals; 30-value D/A converters 215 and 225 that switches the reference voltages ±VREF according to input and outputs analogue signals; analogue adders 213 and 223 that subtract the outputs of the 1/1.5D/A converters 212 and 222 or the 30-value D/A converters 215 and 225 from the analogue input signals; analogue operation circuits 214 and 224 that receives as input the output of the analogue adders 213 and 223 and function as amplifiers in pipeline mode and as integrators in delta-sigma mode; and analogue switches 216 to 218 and 226 to 228.

Also, part of the pipeline-scheme A/D converter is used as a quantizer in delta-sigma mode.

The pipeline stages 203 to 204, adopting the same configuration, are composed of: 1.5-bit A/D converters 231 and 241 for pipeline that convert analogue input signals into digital signals; 1.5-bit D/A converters 232 and 242 that switch between the pipeline-scheme and the delta-sigma modulation scheme according to the mode in use; analogue adders 233 and 243 that subtract the output of the 1.5 D/A converters 232 and 242 from the analogue input signals; and analogue operation circuits 234 and 244 that receives as input the output of the analogue adders 233 and 243 and function as amplifiers in pipeline mode. The analogue operation circuit 234 has only a function of an amplifier and is unique in that 30-value D/A converters 215 and 225 are not provided and an analogue switch for switching is not provided.

Figure 13:
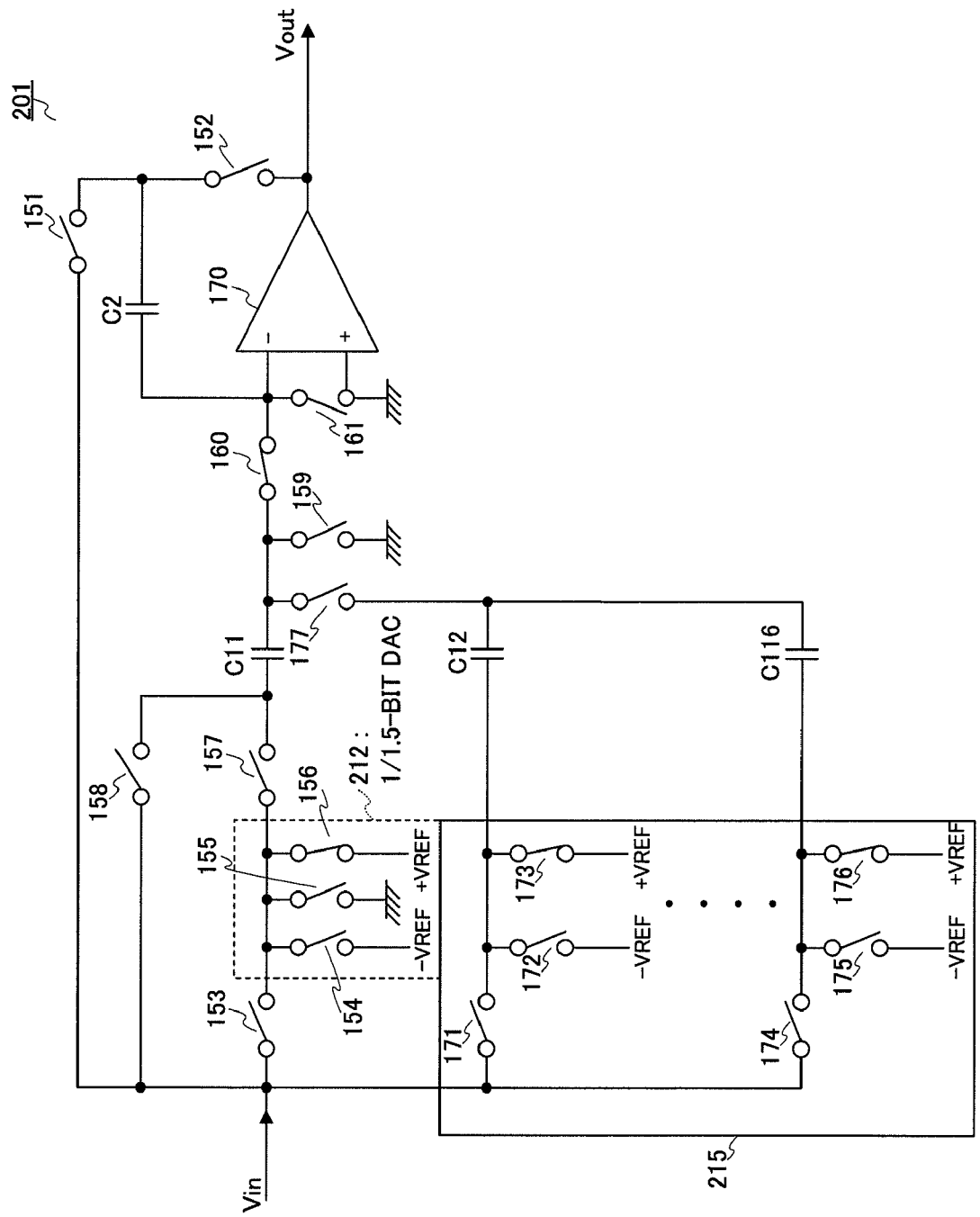
FIG. 13 is a switched capacitor-type analogue circuit diagram showing an internal configuration of a hybrid stage of a hybrid A/D converter according to embodiment 2 of the present invention.

FIG. 13 is a switched capacitor-type analogue circuit diagram that shows the internal configuration of the hybrid stage of the hybrid A/D converter 200. The hybrid stages 201 and 202 adopt the same configuration, so the hybrid stage 201 is shown as a representative. The same symbols as the configuration shown in FIG. 7 are applied to the same components.

The analogue circuit of the hybrid stage 201, in FIG. 13, adopts a configuration adding a 30-value D/A converter and plurality of capacitors to the analogue circuits of the hybrid stage 101 shown in FIG. 7, and is composed of: analogue switches 151 to 161 and 171 to 177; 16 sampling capacitors C11 and C12, . . . , C116; operational amplifier 170; 1/1.5-bit D/A converter 212 that switches the reference voltages ±VREF and 0 according to input and outputs analogue signals; and the 30-value D/A converter 215 that switches the reference voltages ±VREF and outputs analogue signals.

The operations of the hybrid A/D converter 200 described above will now be explained.

The hybrid A/D converter 200 is provided with the hybrid stages 201 and 202 that have analogue operation circuits 214 and 224 that function as amplifiers in pipeline mode and as integrators in delta-sigma mode; and the hybrid stages 203, 204 that form pipeline stages with the hybrid stages 201 and 202 in pipeline mode. Therefore, between the circuit configurations shown FIGS. 12 and 13, the circuit that becomes active is different in pipeline mode and in delta-sigma mode. The operations of each mode will now be explained.

Figure 14:
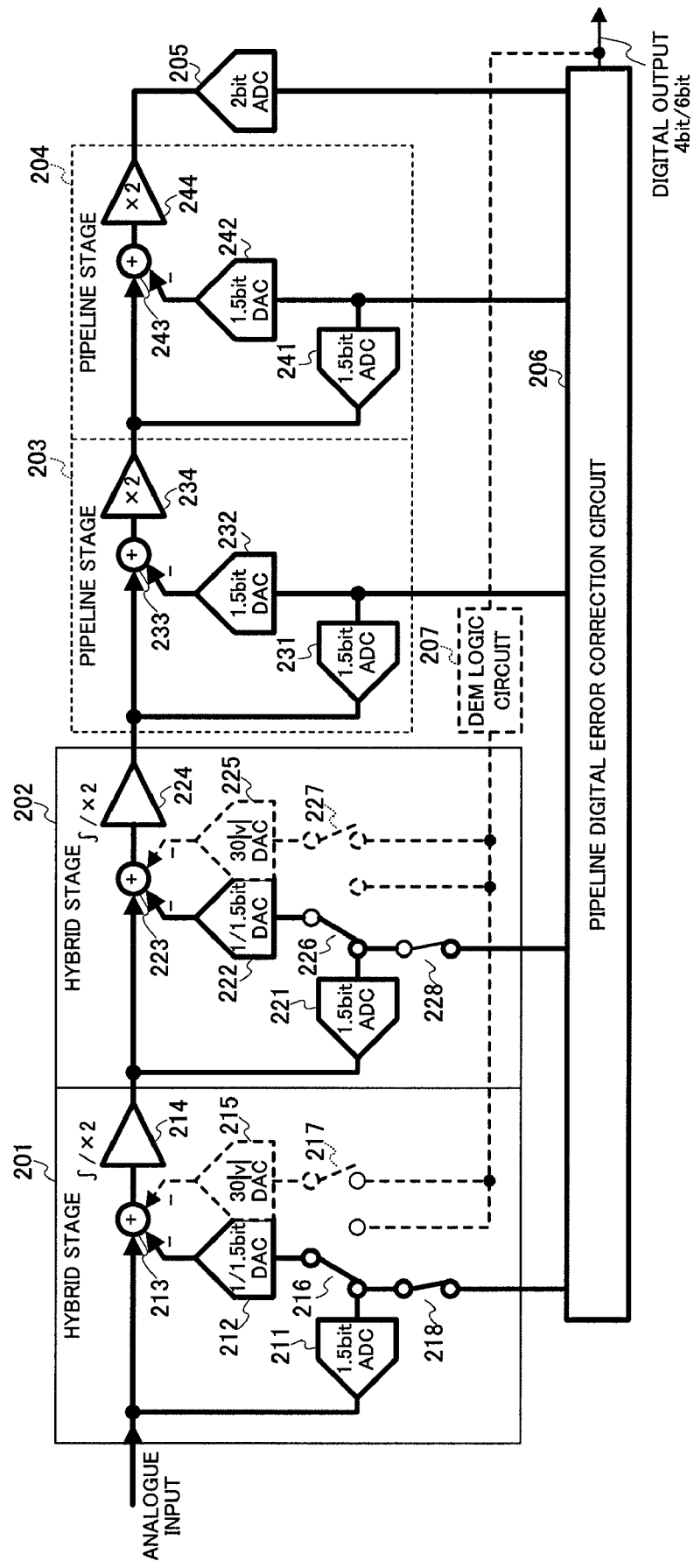
FIG. 14 is a circuit diagram showing an operation of the pipeline A/D converter shown in FIG. 12 in pipeline mode.
Figure 15:
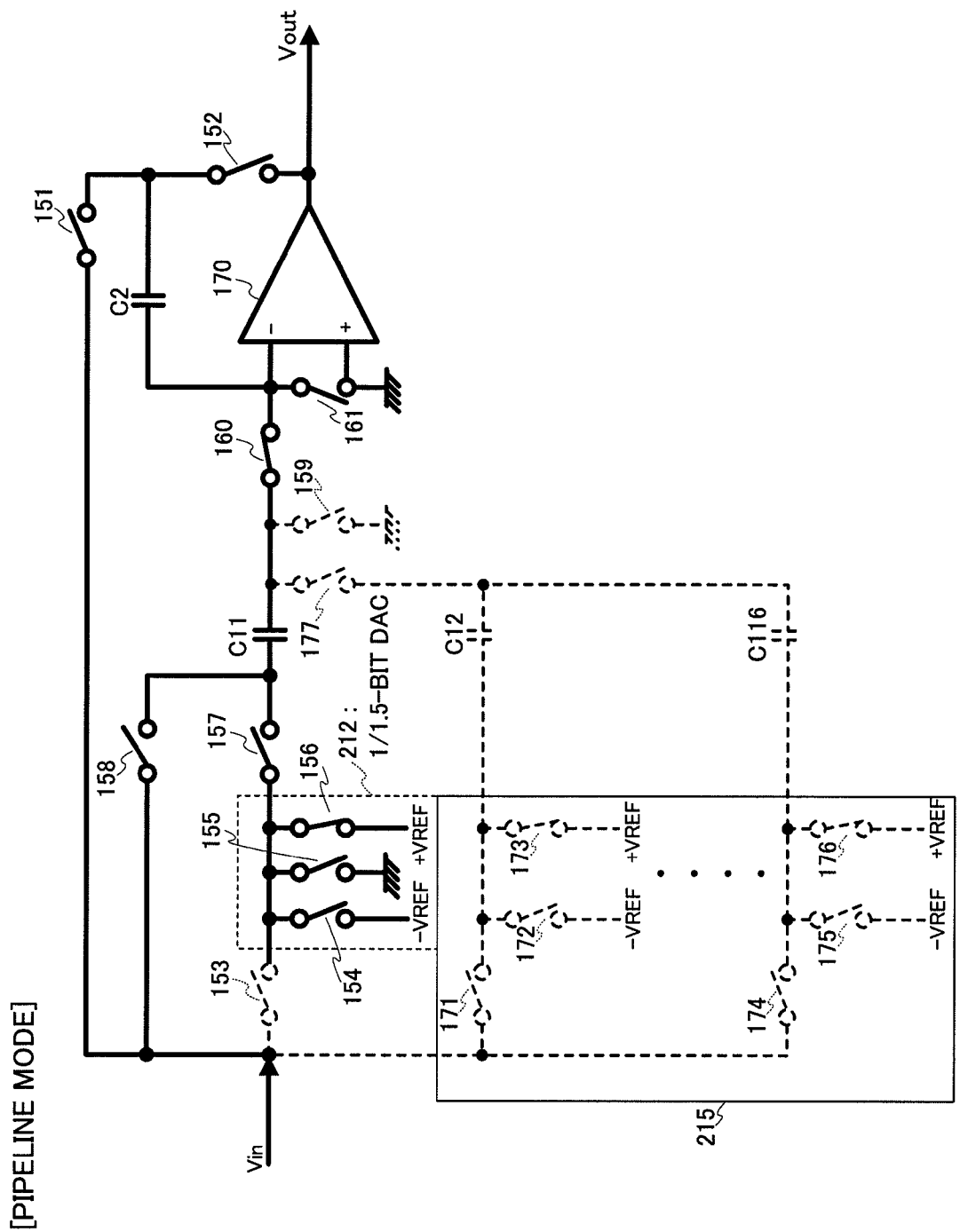
FIG. 15 is a circuit diagram showing an operation of an analogue circuit of the hybrid stage shown in FIG. 13 in pipeline mode.

FIG. 14 is a circuit diagram showing the operations of the hybrid A/D converter 200 shown in FIG. 6 in pipeline mode. FIG. 15 is a circuit diagram showing the operations of the analogue circuit of the hybrid stage 201 shown in FIG. 13 in pipeline mode. In FIGS. 14 and 15, the function sections in an active state are shown with solid, bold lines and function sections in an inactive state are shown with dashed lines.

[Pipeline Mode]

FIG. 14 shows the operations of the hybrid stages 201 to 202 and the pipeline stages 203 and 204 in pipeline mode. FIG. 14 shows a representative of the operation of the hybrid stage 201 in pipeline mode, but the operations are the same as those for the hybrid stage 202. Also, the pipeline stages 203 to 204 have the same configuration as the hybrid stages 201 and 202 in pipeline mode. Therefore, the hybrid stages 201 to 202 and the pipeline stages 203 and 204 can be the fourth stage of the pipeline stage in pipeline mode.

As shown in FIG. 14, the analogue switches 216 and 226 are connected to the output of the 1.5-bit A/D converters 211 and 221; the analogue switches 218 and 228 are ON; the analogue switches 217 and 227 are OFF, and the analogue operation circuits 214 and 224 in each hybrid stage is being used as an amplifier to function as a pipeline-scheme A/D converter.

As shown in FIG. 15, the analogue circuit of the hybrid stage 201 is composed of analogue switches 152, 154, 155, 156, 157, 158, 159, 160, 161, 151, 152, 171 to 177; 16 capacitors C11 and C12 . . . , C116; an operational amplifier 170; a 1/1.5-bit D/A converter 212 that switches the reference voltages ±VREF and 0 according to input and outputs analogue signals; and the 30-value D/A converter 215 that switches the reference voltages ±VREF according to input and outputs analogue signals. In pipeline mode, this switches the analogue switches to set the circuits shown with solid, bold lines in FIG. 15 to an active state.

Specifically, the analogue switches 153 and 159 are OFF; the analogue switch 160 is ON; the analogue switch 177, and analogue switches 171 to 174 are OFF. This enables the analogue circuit of the hybrid stage to function as a pipeline stage.

First, the analogue switch 158 and analogue switch 151 are ON; the analogue switches 157 and analogue switch 152 are OFF; and the analogue switch 161 is ON. In this state, input signals are applied to the capacitors C11 and C12. Next, when the analogue switch 161 is OFF, the input signals are sampled and saved. Next, the analogue switch 157 and analogue switch 152 are ON, and the analogue switch 158 and analogue switch 151 are OFF. The 1/1.5-bit D/A converter 212 selects the voltages of +VREF, 0, or −VREF according to the output of the 1.5-bt A/D converter 211 and applies that to the capacitor C11. When C1=C2=C, Vout is given by the equation 1 described above.

As shown in the equation 1 above, the hybrid stages 202 and 201 and the pipeline stages 203 and 204 implement the pipeline stage function which is to subtract the D/A converter results from the input signals and amplify that two fold.

Figure 16:
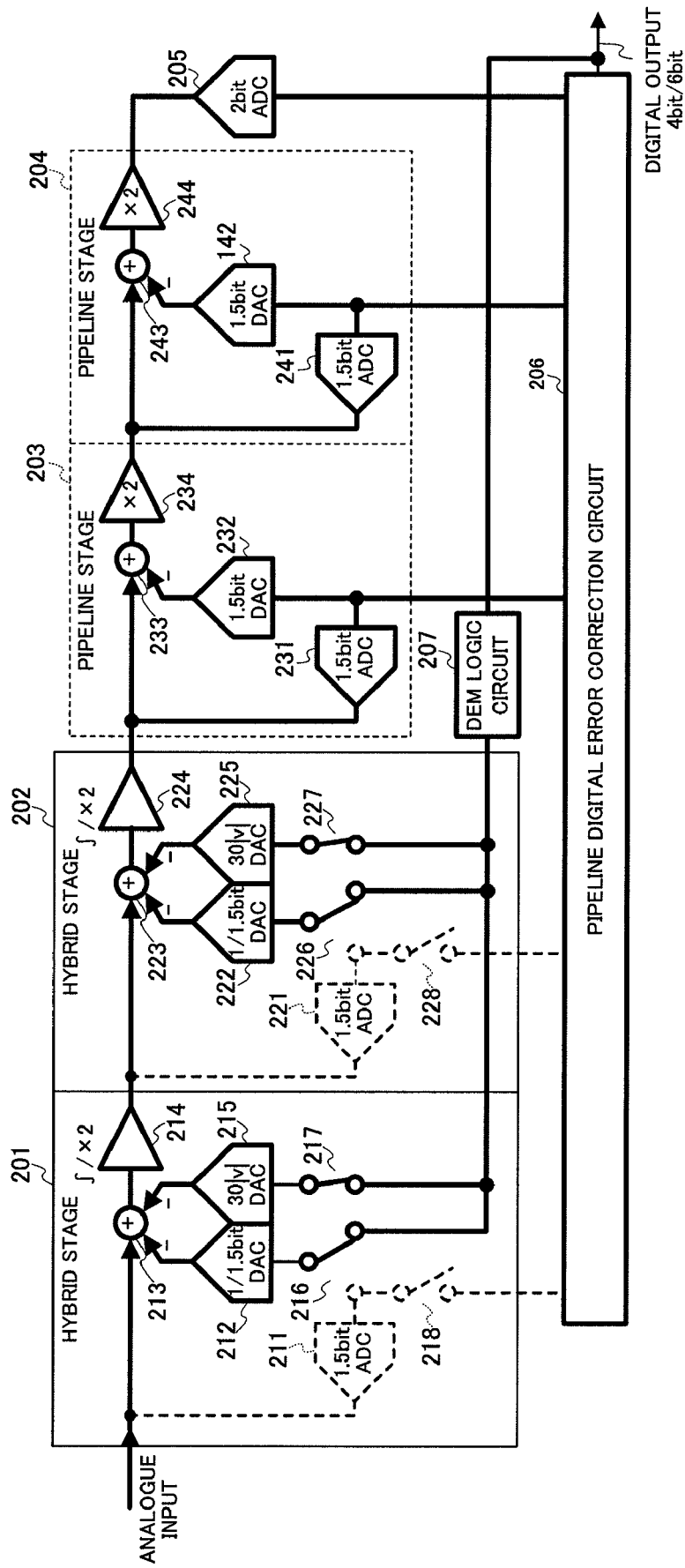
FIG. 16 is a circuit diagram showing an operation of the hybrid A/D converter shown in FIG. 12 in delta-sigma mode.
Figure 17:
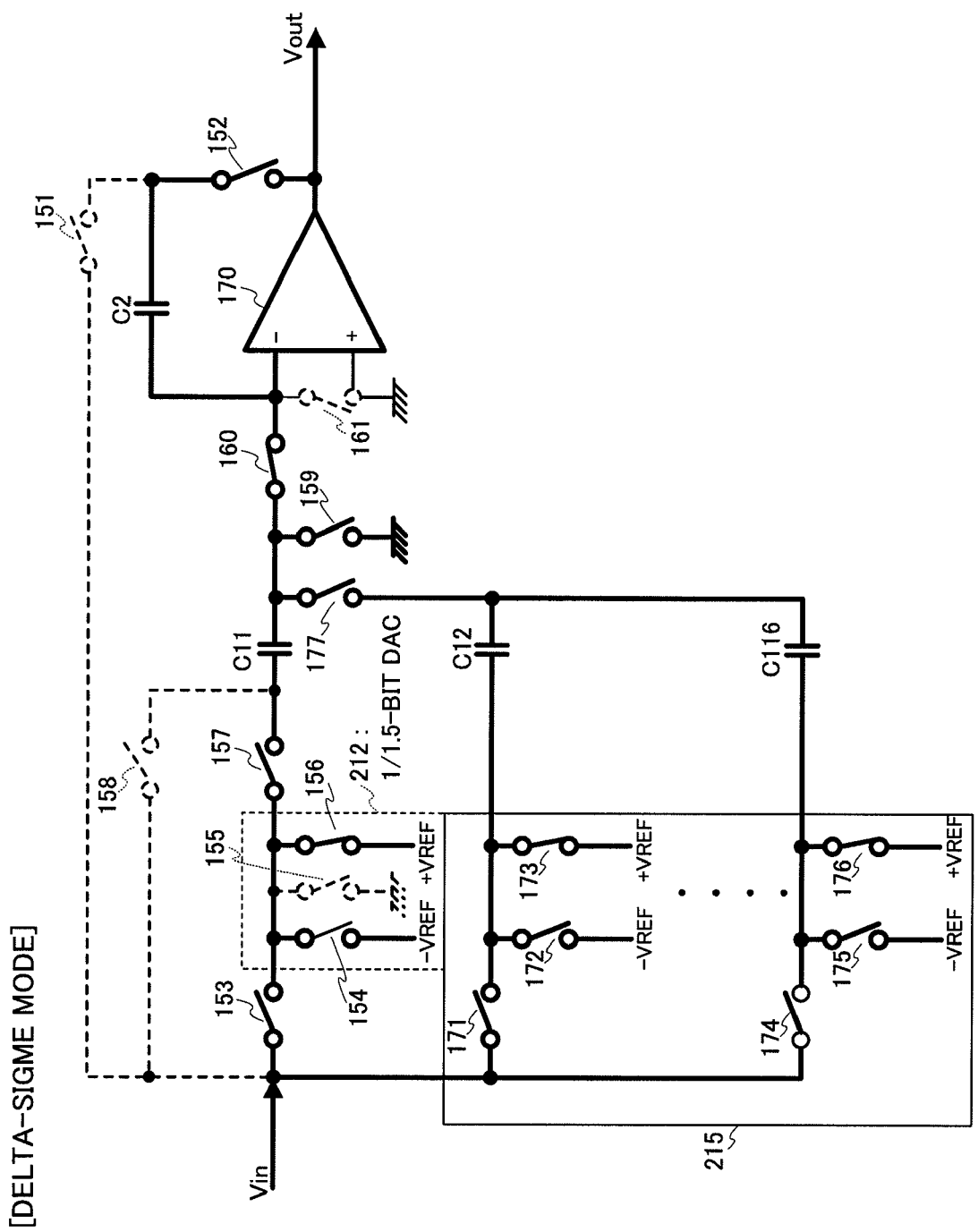
FIG. 17 is a circuit diagram showing an operation of the analogue circuit of the hybrid stage shown in FIG. 13 in delta-sigma mode.

FIG. 16 is a circuit diagram showing the operations of the hybrid A/D converter 200 shown in FIG. 12 in delta-sigma mode. FIG. 17 is a circuit diagram showing the operations of the analogue circuit in delta-sigma mode of the hybrid stage 201 shown in FIG. 13. In FIGS. 16 and 17, the function sections in an active state are shown with solid, bold lines, and function sections in an inactive state are shown with dashed lines.

[Delta-Sigma Mode]

As shown in FIG. 16, the analogue switches 216 and 226 are connected to the output of the DEM logic circuit 207; the analogue switches 218 and 228 are ON; the analogue switches 217 and 227 are OFF; and the analogue operation circuits 214 and 224 in hybrid stages 201 and 202 are used as an integrator, so that the hybrid stage analogue circuit functions as a switched capacitor-type analogue circuit that executes operations at each stage of the delta-sigma modulation-scheme A/D converter.

As shown in FIG. 17, first, the analogue switch 160 is OFF; the analogue switches 153 and analogue switches 171 to 174, and analogue switch 159 are ON. This causes the input signals to be sampled and saved in the sampling capacity of the capacitors C11 to C116. Next, substantially at the same time these analogue switches are turned OFF, analogue switch 160 is turned ON; at the same time, analogue switches 154 or 155, and −VREF analogue switches 172 and 175 or +VREF analogue switches 173 and 176 of the analogue switches 172 to 175 are ON, and the +VREF or −VREF connected to the ends of the these analogue switches is charged and the electrical charge saved in the sampling capacitors is charged or discharged and subtracted, and integrated to the integral capacitor C2. In other words, an analogue operation function for delta-sigma modulation to add (or subtract), D/A convert and integrate, is fulfilled by this switched capacitor-type analogue circuit.

According to this hybrid A/D converter 200 of the present embodiment, similar to Embodiment 1, the components of a switched capacitor circuit, which is a primary analogue circuit, are shared between the pipeline scheme and the delta-signal modulation scheme, so that two types of A/D converters—namely, a pipeline-scheme A/D converter (see FIGS. 14 and 15) that is suited for the requirements of a high-speed, yet comparatively low-resolution A/D converter, and a delta-sigma modulation-scheme A/D converter (see FIGS. 16 and 17) that is suited for the requirements of a comparatively low-speed, yet high resolution A/D converter—are provided, and it is possible to minimize the increase in the circuit scale. Furthermore, by applying a pipeline-scheme for a high-speed, yet comparatively low-resolution A/D converter, high speed clock for high-oversampling is not necessary, so that it is possible to lighten the requirements on the operational amplifier slew rate and settling characteristics, and keep the increase in power consumption to a minimum.

The distinct effects of this embodiment will now be described. For a general A/D converter, a 1-bit A/D converter or a 2-bit A/D converter is used (usually a 1-bit A/D converter), as the final ½-bit A/D converter 105 shown in FIG. 6. The hybrid A/D converter 200 of this embodiment is configured to use part of the pipeline A/D converter as a quantizer, thereby supporting multi-bit system and improving the accuracy of delta-signal modulation. Of course, delta-sigma modulation is able to support multi-bit system, but, to begin with, the pipeline-scheme has a comparatively low current consumption, comparatively low number of bits and is suitable for comparatively high speed application. To enable application of multi-bits for the delta-sigma scheme while dually equipping functions as a pipeline-scheme such as the hybrid A/D converter 200 of this embodiment provides advantage in both cost and performance.

The desired specifications for the A/D converter using both schemes are different. Furthermore, because the desired specifications for the analogue circuits between both schemes are different, it is possible to further lower the appropriate power consumption by applying a configuration that changes the capacitor, switch sizes and operational amplifier power consumption according to the desired specifications.

The explanations above are illustrations of preferred embodiments of the present invention, but they are not intended to be construed as limitations of its scope.

Examples were provided for a four-stage pipeline stage, and tertiary 1-bit and quartic 4-bits for delta-sigma modulation, but any combination is possible. To provide an example, it is possible to implement 8 stages for the pipeline stage, and quintic 2-bits for the delta-sigma modulation.

Also, the analogue circuits are not limited to a single-end type, but are also effective in a differential type (that is noise-robust). Furthermore, the hybrid stage is configured to share the operational amplifier, but this is effective from the aspect of the lowest power consumption. Still further, as long as the analogue switch is an element that performs the switching operation, any switching element can be applied.

According to the embodiment above, the term hybrid A/D converter is used, but this is only to facilitate the explanation; it can be an A/D converter or a delta-sigma modulator.

It can also go without saying that the circuits, for example the number of pipeline stages that compose the hybrid A/D converter, and the number of bits and methods of connection are not to be construed to be limited by the descriptions provided herein.

According to the present invention, two types of A/D converters—namely, a pipeline-scheme A/D converter that is suited for the requirements of a high-speed, yet comparatively low-resolution A/D converter, and a delta-sigma modulation-scheme A/D converter that is suited for the requirements of a comparatively low-speed, high resolution A/D converter—are provided, and the components of a switched capacitor circuit, which is a primary analogue circuit in an A/D converter, are shared between the two A/D converters, it is possible to minimize the increase in the circuit scale and minimize power consumption because there is no need for a high-speed clock required in high-oversampling when a circuit functions as a high-speed, comparatively low resolution A/D converter.

Therefore, the hybrid A/D converter of the present invention can minimize an increase in the scale of the circuits, and, since a high clock speed required in high-oversampling is not necessary when functioning as a high-speed, yet comparatively low-resolution A/D converter, minimizes power consumption, and can be used as part of a multi-mode communication system supporting receiver in a wireless communication system such as that of a mobile telephone. Also, this can be widely applied to A/D converters in electronic devices other than a wireless communication system such as that of a mobile telephone.

What is claimed is:

1. An A/D converter, comprising:
   an A/D converter for pipeline use, that converts an analogue input signal into a digital signal;
   a D/A converter that switches between pipeline use and delta-sigma modulation use according to a mode in use;
   an analogue adder that subtracts an output of the D/A converter from the analogue input signal; and
   a hybrid stage comprising an analogue operation circuit that receives as input an output of the analogue adder and functions as an amplifier in a pipeline mode and as an integrator in a delta-sigma mode, wherein the hybrid stage comprises:
   an A/D converter for pipeline use, that converts an analogue input signal into a digital signal;
   a first D/A converter for pipeline use;
   a second D/A converter for delta-sigma modulation use;
   an analogue adder that subtracts an output of the first and second D/A converters from the analogue input signal; and
   an analogue operation circuit that receives as input an output of the analogue adder and functions as an amplifier in the pipeline mode and as an integrator in the delta-sigma mode.

* * * * *